Figure 1:
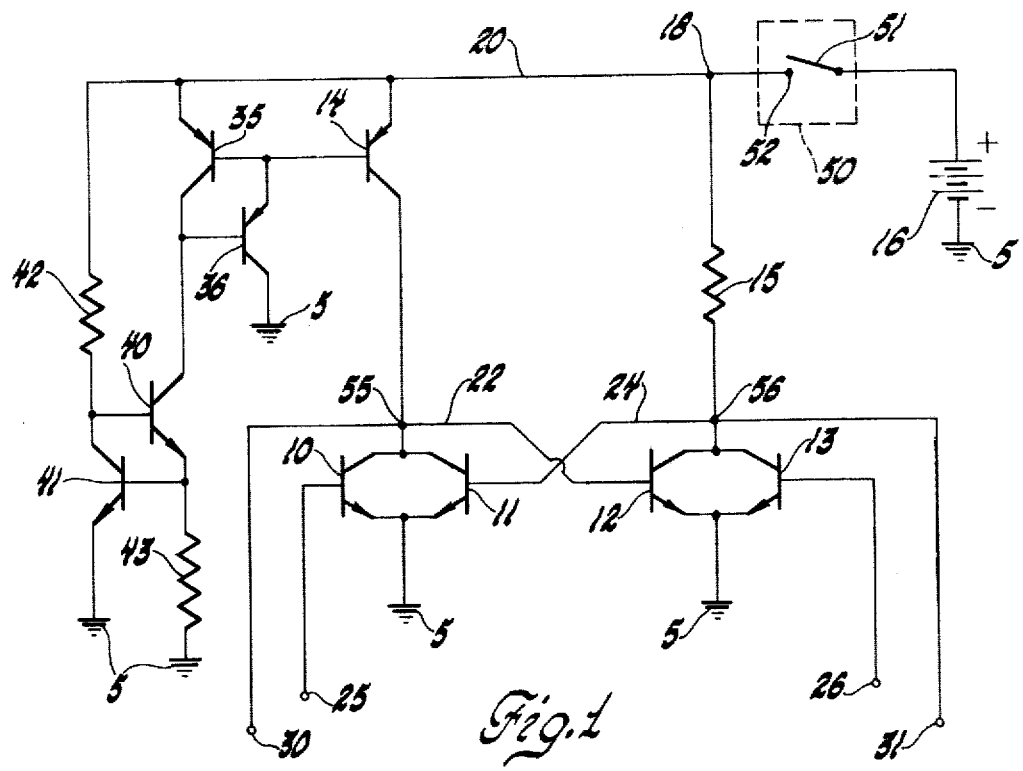

United States Patent [19]

Hart

[11] 4,306,162

[45] Dec. 15, 1981

[54] R-S FLIP-FLOP CIRCUIT HAVING A PREDETERMINED INITIAL OPERATING CONDITION

[75] Inventor: William Hart, Kokomo, Ind.

[73] Assignee: General Motors Corporation, Detroit, Mich.

[21] Appl. No.: 89,579

[22] Filed: Oct. 29, 1979

[51] Int. Cl.³ .......................................... H03K 3/287
[52] U.S. Cl. .................................................. 307/291
[58] Field of Search ............... 307/291, 296; 328/202, 328/206

[56] References Cited

U.S. PATENT DOCUMENTS 2,909,680 10/1959 Moore et al. .................. 307/291 X
3,380,002 4/1968 Hogue ............................ 331/113 R Primary Examiner—James B. Mullins
Attorney, Agent, or Firm—Richard G. Stahr

[57] ABSTRACT

The collector-emitter electrodes of each of two NPN transistors having the collector electrode of each direct current cross connected to the base electrode of the other are connected, respectively, across an operating potential source through a collector load resistor element and an active collector load element. A biasing circuit arrangement is effective upon each application of supply potential to activate the active collector load element a period of time later than that at which base-emitter drive current is initiated through the base-emitter junction of the NPN transistor having the collector-emitter electrodes thereof connected across the supply potential source through the active collector load element whereby this transistor is always triggered conductive first upon each application of supply potential.

4 Claims, 2 Drawing Figures

R-S FLIP-FLOP CIRCUIT HAVING A PREDETERMINED INITIAL OPERATING CONDITION

This invention is directed to an R-S flip-flop circuit and, more specifically, to an R-S flip-flop circuit of the type that always operates to the same predetermined initial one of two operating conditions upon each application of supply potential.

Upon the initial energization of electrical circuitry including R-S flip-flop circuits, the initial operating condition of the R-S flip-flop circuits subsequent to each initial application of supply potential will be random and unpredictable. With certain applications, it is imperative that, upon each circuit energization, the initial operating condition of each of the included R-S flip-flop circuits be the same every time as selected. Therefore, the provision of an R-S flip-flop circuit that is arranged to operate to the same predetermined initial one of two operating conditions upon each application of supply potential is desirable.

It is, therefore, an object of this invention to provide an improved R-S flip-flop circuit.

It is another object of this invention to provide an improved R-S flip-flop circuit that is arranged to always operate to the same predetermined initial one of two operating conditions upon each application of supply potential.

It is another object of this invention to provide an improved R-S flip-flop circuit having an active collector load element included in the operating potential input circuitry to ensure that the flip-flop circuit will always operate to the same predetermined initial one of two operating conditions upon each application of supply potential.

In accordance with this invention, a transistorized R-S flip-flop circuit that always operates to the same predetermined initial one of two operating conditions upon each application of supply potential is provided wherein an active collector load element is included in the collector-emitter energizing circuit of one of the active transistors to ensure that this transistor is rendered conductive first upon each application of supply potential.

Figure 2:
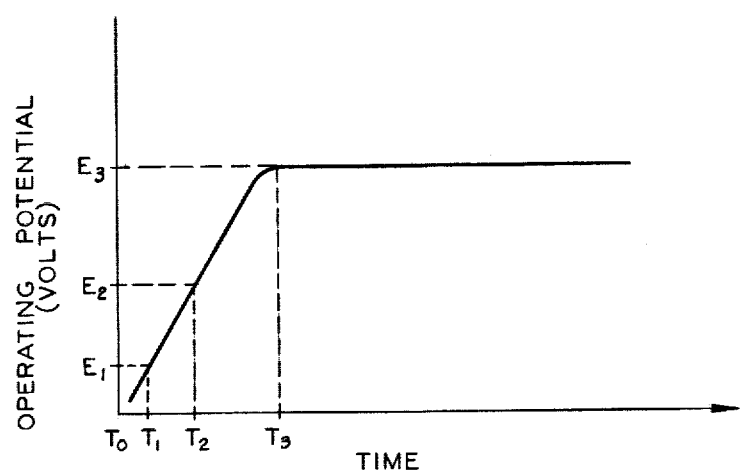

For a better understanding of the present invention, together with additional objects, advantages and features thereof, reference is made to the following description and accompanying drawing in which:

FIG. 1 sets forth the R-S flip-flop circuit of this invention in schematic form; and FIG. 2 is a curve useful in understanding the operation of the circuitry of FIG. 1.

As point of reference or ground potential is the same point electrically throughout the circuit, it is illustrated in FIG. 1 of the drawing by the accepted schematic symbol and is referenced by the numeral 5.

Referring to FIG. 1, the actual R-S flip-flop circuit of this invention includes transistors 10 through 14 and resistor 15. As is well known in the electronics art, the R-S flip-flop circuit is a bistable element having two stable operating conditions to which it may be triggered upon the application of the proper polarity electrical signal to the corresponding one of the data input circuits. The operating potential input circuitry of this R-S flip-flop circuit that is adapted for connection across an operating potential source, such as a conventional storage battery 16, may be an operating potential input terminal 18, positive polarity potential lead 20, and point of reference or ground potential 5. The collector electrode of NPN transistor 11 is connected to the base electrode of NPN transistor 12 through a corresponding direct current cross connection 22 and the collector electrode of NPN transistor 12 is connected to the base electrode of NPN transistor 11 through a corresponding direct current cross connection 24. The collector-emitter electrodes of NPN transistor 12 and a resistive collector load element, resistor 15, are connected in series across positive polarity potential lead 20 and point of reference or ground potential 5 of the operating potential input circuit in such a sequence that the collector load resistor 15 and the base electrode of NPN transistor 11 are connected together through the corresponding cross connection 24 and the collector-emitter electrodes of NPN transistor 11 and an active collector load element, PNP transistor 14, are connected in series across positive polarity potential lead 20 and point of reference or ground potential 5 of the operating potential input circuitry in such a sequence that the active collector load transistor 14 and the base electrode of NPN transistor 12 are connected together through the corresponding cross connection 22. With this circuit arrangement, the resistive collector load element, resistor 15, and the base-emitter junction of NPN transistor 11 are connected in series across the operating potential input circuitry and the active collector load element, PNP transistor 14, and the base-emitter junction of NPN transistor 12 are connected in series across the operating potential input circuitry. The collector-emitter electrodes of NPN transistor 10 are connected in parallel with the collector-emitter electrodes of NPN transistor 11 and a data input circuit arrangement such as "R" input terminal 25 is connected to the base electrode of NPN transistor 10. The collector-emitter electrodes of NPN transistor 13 are connected in parallel with the collector-emitter electrodes of NPN transistor 12 and a data input circuit arrangement such as "S" input terminal 26 is connected to the base electrode of NPN transistor 13. The output signals of this circuit may be taken from the collector electrode of each of NPN transistors 11 and 12 through respective output circuit arrangements such as the "Q" output terminal 30 and the "$\overline{Q}$" output terminal 31.

An active load element may be defined as an electrical circuit element that requires an external biasing arrangement and provides either a current gain or a potential gain. As PNP transistor 14 fulfills both of these requirements and is connected in series with the collector-emitter electrodes of NPN transistor 11 across the previously described operating potential input circuit, this device is an active collector load element.

The circuitry including PNP transistors 35 and 36 and active collector load transistor 14 comprises a current source mirror arrangement and the circuiry including NPN transistors 40 and 41 and resistors 42 and 43 establishes the reference current of the current source mirror arrangement that is the collector current of PNP transistor 35. As is well known in the electronics art, with a current source mirror arrangement, the collector current of PNP transistor 35 is mirrored to the collector of the active collector load transistor 14.

In accordance with Kirchoff's Current Law, the sum of the currents directed away from a junction is equal to the sum of the currents directed toward the junction and, conversely, the sum of the currents directed toward a junction is equal to the sum of the currents directed away from the junction. Therefore, the emitter current $I_{e40}$ of transistor 40 may be expressed:

$$I_{e40} = I_{b40} + I_{c40} \tag{I}$$

where:
$I_{b40}$ is the base current of transistor 40 and
$I_{c40}$ is the collector current of transistor 40.

Likewise, the emitter current $I_{e40}$ of transistor 40 may be expressed: $I_{e40} = I_{b40} + I_{r43}$ (II)

where:
$I_{b41}$ is the base current of transistor 41 and
$I_{r43}$ is the current through resistor 43.

as the current $I_{r43}$ may be expressed:

$$I_{r43} = V_{be41}/R_{r43} \tag{II}$$

where:
$V_{be41}$ is the base-emitter junction voltage drop across transistor 41 and
$R_{r43}$ is the ohmic value of resistor 43.

The emitter current $I_{e40}$ of transistor 40 may be expressed:

$$I_{e40} = I_{b41} + V_{b341}/I_{r43} \tag{IV}$$

by substitution in expression II, $$I_{b40} + I_{c40} = I_{b41} + V_{be41}/I_{r43} \tag{V}$$

as transistors 40 and 41 are matched devices, $I_{b40} = I_{b41}$.

Consequently, these base currents cancel out of expression V leaving the expression:

$$I_{c40} = V_{be41}/I_{r43} \tag{VI}$$

From this expression, it is obvious that the collector current $I_{c40}$ of transistor 40 is determined by the resistance value of resistor 43. This is the reference current, the collector current of transistor 35, of the current source mirror arrangement that is mirrored to the collector of the active collector load transistor 14 in a manner well known in the art.

As is well known in the art, upon the initial application of supply potential to an electronic circuit, the build-up of operating potential level across the circuitry to the maximum operating potential level requires a finite period of time because of the stray inductance and capacitance values inherent in the electronic circuitry. In FIG. 2 of the drawing wherein the operating potential in volts is plotted against time, this build-up of operating potential level across an electronic circuit is illustrated by the single curve. Upon the initial application of operating potential to an electronic computer circuit at time $T_o$, for example, the rate of increase of operating potential level is of the order of 0.05 of a volt per microsecond. With a 12-volt power supply, therefore, the finite time required for the operating potential level to reach the maximum value $E_3$ at time $T_3$ is of the order of 240 microseconds.

Upon the initial application of supply potential by the closure of movable contact 51 of switch 50 to stationary contact 52, the potential level across positive polarity potential lead 20 and point of reference or ground potential 5 builds up with time as illustrated by the curve of FIG. 2. The potential upon junction 55, however, remains at substantially zero potential because the active collector load transistor 14 is not conductive.

When at time $T_1$ of FIG. 2 the supply potential level has increased to a value $E_1$ great enough to initiate base-emitter drive current through NPN transistor 11, this device is conditioned for conduction through the collector-emitter electrodes thereof. At this time $T_1$ the potential level value $E_1$ applied across collector load resistor 15 and the base-emitter junction of transistor 11 is equal to the sum of the potential drop across collector load resistor 15 ($IR_{15}$) plus the base-emitter diode drop of NPN transistor 11 ($V_{bell}$) and may be expressed, $E_1 = IR_{15} + V_{bell}$.

When at time $T_2$ of FIG. 2 the supply potential level has increased to a value $E_2$ great enough to initate drive current through transistors 35, 36, 40 and 41, these devices are rendered conductive through the current carrying electrodes thereof. At this time $T_2$, the potential level value $E_2$ applied across these transistors is equal to the sum of the emitter-base diode drop of PNP transistor 35 ($V_{eb35}$) plus the emitter-base diode drop of PNP transistor 36 ($V_{eb36}$) plus the saturation voltage of NPN transistor 40 ($V_{ces40}$) plus the base-emitter diode drop of NPN transistor 41 ($V_{be41}$) and may be expressed, $E_2 = V_{eb35} + V_{eb36} + V_{ces40} + V_{be41}$. Upon the conduction of transistors 35, 36, 40 and 41, the active collector load transistor 14 is rendered conductive at a time later than that at which base-emitter drive current is initiated through transistor 11. Therefore, the collector current of active collector load transistor 14 is conducted to point of reference or ground potential 5 through the collector-emitter electrodes of conducting transistor 11.

As the potential level $E_2$ is of a magnitude greater than that of potential level $E_1$ at which base-emitter drive current is supplied to NPN transistor 11, this potential level $E_2$ always occurs at a time later than that at which potential level $E_1$ occurs. Consequently, the active collector load transistor 14 will always be rendered conductive at a time later than that at which base-emitter drive current is supplied to NPN transistor 11 upon each application of supply potential. Transistor 11, therefore, will always conduct before transistor 12 upon each application of supply potential.

While transistor 11 is conducting, the potential upon junction 55 is substantially ground potential. Consequently, the output signal present upon the "Q" output terminal 30 of the flip-flop circuit is a logic 0 and, since the potential level upon junction 55 is of an insufficient magnitude to supply base-emitter drive current to transistor 12, this device is not conductive. While transistor 12 not conducting, the potential upon junction 56 is of a level substantially equal to supply potential to maintain base-emitter drive current to transistor 11. Consequently, the output signal present upon the "$\overline{Q}$" output terminal 31 is a logic 1. The R-S flip-flop circuit, therefore, will always operate to the same predetermined initial operating condition in which a logic 0 signal is present upon the "Q" output terminal 30 and a logic 1 signal present upon the "$\overline{Q}$" output terminal 31 upon each application of supply potential.

To trigger the flip-flop circuit to the other operating condition, a logic 1 signal is applied to the "S" data input terminal 26 of a sufficient magnitude to supply base-emitter drive current to NPN transistor 13 to render this device conductive through the collector-emitter electrodes. Upon the conduction of transistor 13, the potential upon junction 56 goes to substantially ground potential. As this potential level upon junction 56 is of an insufficient magnitude to maintain base-emitter drive current through NPN transistor 11, this device is rendered not conductive. Upon transistor 11 going not conductive, the potential upon junction 55 goes to a level substantially equal to supply potential. At this time, consequently, the flip-flop circuit has been triggered to the other operating condition in which a logic 1 signal is present upon the "Q" output terminal 30 and a logic 0 signal is present upon the "Q̄" output terminal 31. The logic 1 signal upon junction 55 supplies and maintains base-emitter drive current to NPN transistor 12 to render this device conductive and to maintain this device conductive even after the logic 1 input signal is removed from data input terminal 26. Consequently, the R-S flip-flop remains in this operating condition.

To trigger the flip-flop circuit to the initial operating condition, a logic 1 signal is apppled to the "R" data input terminal 25 of a sufficient magnitude to supply base-emitter drive current to NPN transistor 10 to render this device conductive through the collector-emitter electrodes. Upon the conduction of transistor 10, the potential upon junction 55 goes to substantially ground potential. As this potential level upon junction 55 is of an insufficient magnitude to maintain base-emitter drive current through NPN transistor 12, this device is rendered not conductive. Upon transistor 12 going not conductive, the potential upon junction 56 goes to a level substantially equal to supply potential. At this time, consequently, the flip-flop circuit has been triggered to the initial operating condition in which a logic 1 signal is present upon the "Q̄" output terminal 31 and a logic 0 signal is present upon the "Q" output terminal 30. The logic 1 signal upon junction 56 supplies and maintains base-emitter drive current to NPN transistor 11 to render this device conductive and to maintain this device conductive even after the logic 1 input signal is removed from data input terminal 25. Consequently, the R-S flip-flop remains in this operating condition.

From this description, it is apparent that the data input circuits including input terminals 25 and 26 are respective mutually exclusive input circuitry corresponding to each one of the two operating conditions and that NPN transistors 10 and 13 are responsive to the application of an electrical input signal to either of the data input circuits for effecting for effecting the operation of the flip-flop circuit to the operating condition to which the data input circuit to which the input signal is applied corresponds.

The circuitry including PNP transistors 35 and 36 and NPN transistors 40 and 41 is only one example of a circuit arrangement for providing an external biasing arrangement for active collector load transistor 14. It is to be specifically understood that other external biasing circuit arrangements may be employed without departing from the spirit of this invention.

While a preferred embodiment of the present invention has been shown and described, it will be obvious to those skilled in the art that various modifications and substitutions may be made without departing from the spirit of the invention that is to be limited only to the scope of the appended claims.

The embodiments of the invention in which an exclusive property or privilege is claimed are defined as follows:

1. A bistable flip-flop circuit having operating potential input circuitry adapted for connection across an operating potential source and being of the type that always operates to the same predetermined initial one of two operating conditions upon each application of supply potential, comprising:
   a first and a second transistor each having collector, emitter and base electrodes;
   means for connecting said collector electrode of each of said transistors to said base electrode of the other one of said transistors through a corresponding direct current cross connection;
   respective first and second circuit means for connecting said collector-emitter electrodes of said first transistor and a collector load resistor element in series across said operating potential input circuitry in such a sequence that said collector load resistor element and said base electrode of said second transistor are connected together through the corresponding said cross connection and for connecting said collector-emitter electrodes of said second transistor and an active collector load element in series acrosss said operating potential input circuitry in such a sequence that said active collector load element and said base electrode of said first transistor are connected together through the corresponding said cross connection whereby said collector load resistor element and the base-emitter junction of said second transistor are connected in series across said operating potential input circuitry and said active collector load element and the base-emitter junction of said first transistor are connected in series across said operating potential input circuitry;
   biasing circuit means effective upon each application of operating potential to activate said active collector load element a period of time later than that at which current flow is initiated through said base-emitter junction of said second transistor;
   respective mutually exclusive data input circuit means corresponding to each one of said two operating conditions;
   means responsive to the application of an electrical signal to either of said data input circuit means for effecting the operation of said flip-flop circuit to the operating condition to which said data input circuit means to which said signal is applied corresponds; and
   output circuit means connected to said collector electrode of each of said first and second transistors.

2. A bistable flip-flop circuit having operating potential input circuitry adapted for connection across an operating potential source and being of the type that always operates to the same predetermined initial one of two operating conditions upon each application of supply potential, comprising:
   a first and a second transistor each having collector, emitter and base electrodes;
   means for connecting said collector electrode of each of said transistors to said base electrode of the other one of said transistors through a corresponding direct current cross connection;
   respective first and second circuit means for connecting said collector-emitter electrodes of said first transistor and a collector load resistor element in series across said operating potential input circuitry in such a sequence that said collector load resistor element and said base electrode of said second transistor are connected together through the corresponding said cross connection and for connecting said collector-emitter electrodes of said second transistor and an active collector load element in series across said operating potential input circuitry in such a sequence that said active collector load element and said base electrode of said first transistor are connected together through the corresponding said cross connection whereby said collector load resistor element and the base-emitter junction of said second transistor are connected in series across said operating potential input circuitry and said active collector load element and the base-emitter junction of said first transistor are connected in series across said operating potential input circuitry;

biasing circuit means effective upon each application of operating potential to activate said active collector load element a period of time later than that at which current flow is initiated through said base-emitter junction of said second transistor;

third and fourth transistors each having collector, emitter and base electrodes;

means for connecting said collector-emitter electrodes of one of said third and fourth transistors in parallel across said collector-emitter electrodes of said first transistor;

means for connecting said collector-emitter electrodes of the other one of said third and fourth transistors in parallel across said collector-emitter electrodes of said second transistor;

data input circuit means connected to the said base electrode of each of said third and fourth transistors; and output circuit means connected to said collector electrode of each of said first and second transistors.

3. A bistable flip-flop circuit having operating potential input circuitry adapted for connection across an operating potential source and being of the type that always operates to the same predetermined initial one of two operating conditions upon each application of supply potential, comprising:

a first and a second transistor each having collector, emitter and base electrodes;

means for connecting said collector electrode of each of said transistors to said base electrode of the other one of said transistors through a corresponding direct current cross connection;

respective first and second circuit means for connecting said collector-emitter electrodes of said first transistor and a collector load resistor element in series across said operating potential input circuitry in such a sequence that said collector load resistor element and said base electrode of said second transistor are connected together through the corresponding said cross connection and for connecting said collector-emitter electrodes of said second transistor and an active collector load element in series across said operating potential input circuitry in such a sequence that said active collector load element and said base electrode of said first transistor are connected together through the corresponding said cross connection whereby said collector load resistor element and the base-emitter junction of said second transistor are connected in series across said operating potential input circuitry and said active collector load element and the base-emitter junction of said first transistor are connected in series across said operating potential input circuitry;

biasing circuit means including a current source mirror arrangement and a circuit for establishing a reference current therefor effective upon each application of operating potential to activate said active collector load element a period of time later than that at which current flow is initiated through said base-emitter junction of said second transistor;

third and fourth transistors each having collector, emitter and base electrodes;

means for connecting said collector-emitter electrodes of one of said third and fourth transistors in parallel across said collector-emitter electrodes of said first transistor;

means for connecting said collector-emitter electrodes of the other one of said third and fourth transistors in parallel across said collector-emitter electrodes of said second transistor;

data input circuit means connected to the said base electrode of each of said third and fourth transistors; and output circuit means connected to the said collector electrode of each of said first and second transistors.

4. A bistable flip-flop circuit having operating potential input circuitry adapted for connection across an operating potential source and being of the type that always operates to the same predetermined initial one of two operating conditions upon each application of supply potential, comprising:

a first and a second transistor each having collector, emitter and base electrodes;

means for connecting said collector electrode of each of said transistors to said base electrode of the other one of said transistors through a corresponding direct current cross connection;

respective first and second circuit means for connecting said collector-emitter electrodes of said first transistor and a collector load resistor element in series across said operating potential input circuitry in such a sequence that said collector load resistor element and said base electrode of said second transistor are connected together through the corresponding said cross connection and for connecting said collector-emitter electrodes of said second transistor and the current carrying elements of a third transistor in series across said operating potential input circuitry in such a sequence that said current carrying elements of said third transistor and said base electrode of said first transistor are connected together through the corresponding said cross connection whereby said collector load resistor element and the base-emitter junction of said second transistor are connected in series across said operating potential input circuitry and said current carrying elements of said third transistor and the base-emitter junction of said first transistor are connected in series across said operating potential input circuitry;

biasing circuit means including a current source mirror arrangement and circuitry for establishing a reference current therefor effective upon each application of operating potential to activate said third transistor a period of time later than that at which current flow is initiated through said base-emitter junction of said second transistor;

fourth and fifth transistors each having collector, emitter and base electrodes;

means for connecting said collector-emitter electrodes of one of said fourth and fifth transistors in parallel across said collector-emitter electrodes of said first transistor;

means for connecting said collector-emitter electrodes of the other one of said fourth and fifth transistors in parallel across said collector-emitter electrodes of said second transistor;

data input circuit means connected to the said base electrode of each of said fourth and fifth transistors; and output circuit means connected to the said collector electrode of each of said first and second transistors.

* * * * *